(12) United States Patent
Boo et al.

(10) Patent No.: US 12,374,612 B2
(45) Date of Patent: Jul. 29, 2025

(54) MICROELECTRONIC DEVICE PACKAGES AND RELATED METHODS AND SYSTEMS

(71) Applicant: Micron Technology, Inc., Boise, ID (US)

(72) Inventors: Kelvin Tan Aik Boo, Penaga (MY); Wen Wei Lum, Kedah (MY); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 519 days.

(21) Appl. No.: 17/930,304

(22) Filed: Sep. 7, 2022

(65) Prior Publication Data

US 2024/0079306 A1 Mar. 7, 2024

(51) Int. Cl.
*H01L 23/498* (2006.01)
*H01L 21/48* (2006.01)
*H01L 23/00* (2006.01)

(52) U.S. Cl.
CPC .... *H01L 23/49838* (2013.01); *H01L 21/4846* (2013.01); *H01L 23/49816* (2013.01); *H01L 23/49894* (2013.01); *H01L 24/16* (2013.01); *H01L 24/32* (2013.01); *H01L 24/73* (2013.01); *H01L 24/81* (2013.01); *H01L 24/13* (2013.01); *H01L 24/48* (2013.01); *H01L 2224/13147* (2013.01); *H01L 2224/16227* (2013.01); (Continued)

(58) Field of Classification Search
CPC ........... H01L 23/49838; H01L 21/4846; H01L 23/49816; H01L 23/49894; H01L 24/16; H01L 24/32; H01L 24/73; H01L 24/81; H01L 24/13; H01L 24/48; H01L 2224/16227; H01L 2224/16238; H01L 2224/32145; H01L 2224/32225; H01L 2224/48225; H01L 2224/73204; H01L 2224/73215; H01L 2224/73265; H01L 2224/81815; H01L 2924/1433; H01L 2924/1438; H01L 2924/35121; H01L 23/49822; H01L 24/14; H01L 23/49811; H01L 21/54; H01L 23/24; H10B 80/00
See application file for complete search history.

(56) References Cited

U.S. PATENT DOCUMENTS 6,437,417 B1 * 8/2002 Gilton ............... H01L 21/76235
438/424
6,583,060 B2 * 6/2003 Trivedi ................ H10D 84/038
257/E21.233

(Continued)

*Primary Examiner* — Douglas W Owens
(74) *Attorney, Agent, or Firm* — TraskBritt

(57) ABSTRACT

A microelectronic device package includes a microelectronic device, a masking material defined (MMD) contact, and a non-masking material defined (NMMD) contact. The microelectronic device is supported on, and electrically connected to, one of a package substrate and a redistribution layer. The MMD contact is located in a first region of the one of the package substrate and the redistribution layer and facilitates a first electrical connection between the microelectronic device and the one of the package substrate and the redistribution layer. The NMMD contact is located in a second, different region of the one of the package substrate and the redistribution layer and facilitates a second electrical connection between the microelectronic device and the one of the package substrate and the redistribution layer. Related methods and systems are also disclosed.

27 Claims, 9 Drawing Sheets

(52) U.S. Cl.
CPC ............... *H01L 2224/16238* (2013.01); *H01L 2224/32145* (2013.01); *H01L 2224/32225* (2013.01); *H01L 2224/48225* (2013.01); *H01L 2224/73204* (2013.01); *H01L 2224/73215* (2013.01); *H01L 2224/73265* (2013.01); *H01L 2224/81815* (2013.01); *H01L 2924/1433* (2013.01); *H01L 2924/1438* (2013.01); *H01L 2924/35121* (2013.01)

(56) References Cited

U.S. PATENT DOCUMENTS

| | | | | |
|---|---|---|---|---|
| 2007/0045797 | A1* | 3/2007 | Lee | H01L 24/05 |
| | | | | 257/E23.125 |
| 2011/0159654 | A1* | 6/2011 | Kronholz | H10D 64/017 |
| | | | | 257/E21.409 |
| 2019/0157537 | A1* | 5/2019 | Namiki | H10H 20/857 |
| 2024/0071990 | A1* | 2/2024 | Boo | H01L 24/05 |

* cited by examiner

MICROELECTRONIC DEVICE PACKAGES AND RELATED METHODS AND SYSTEMS

FIELD

This disclosure relates generally to microelectronic device packages and related methods and systems. More specifically, this disclosure relates to designs for, and techniques for forming, electrical connections within microelectronic device packages that may reduce the risk of delamination between materials within the microelectronic device packages, which may increase reliability and reduce the risk of failure.

BACKGROUND

When packaging microelectronic devices, the packaging may at least partially be used to route electrical connections to and from a microelectronic device, such as to more easily form connections to higher-level packaging. For example, a microelectronic device may be electrically and physically connected to a package substrate or a redistribution layer by electrically conductive elements (e.g., masses of solder) interposed between bond pads of the microelectronic device and contacts of the package substrate or the redistribution layer. An underfill material may be used to fill remaining space between the microelectronic device and the package substrate or the redistribution layer. The microelectronic device, the underfill material, and portions of the package substrate or redistribution layer may be encapsulated in an encapsulant. Routing elements within the package substrate or the redistribution layer may route electrical connections from the contacts to output pads, and the output pads of the package substrate or redistribution layer may then be used for connection to higher-level packaging (e.g., for connection to a motherboard).

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings. In the drawings:

DETAILED DESCRIPTION

Figure 1:
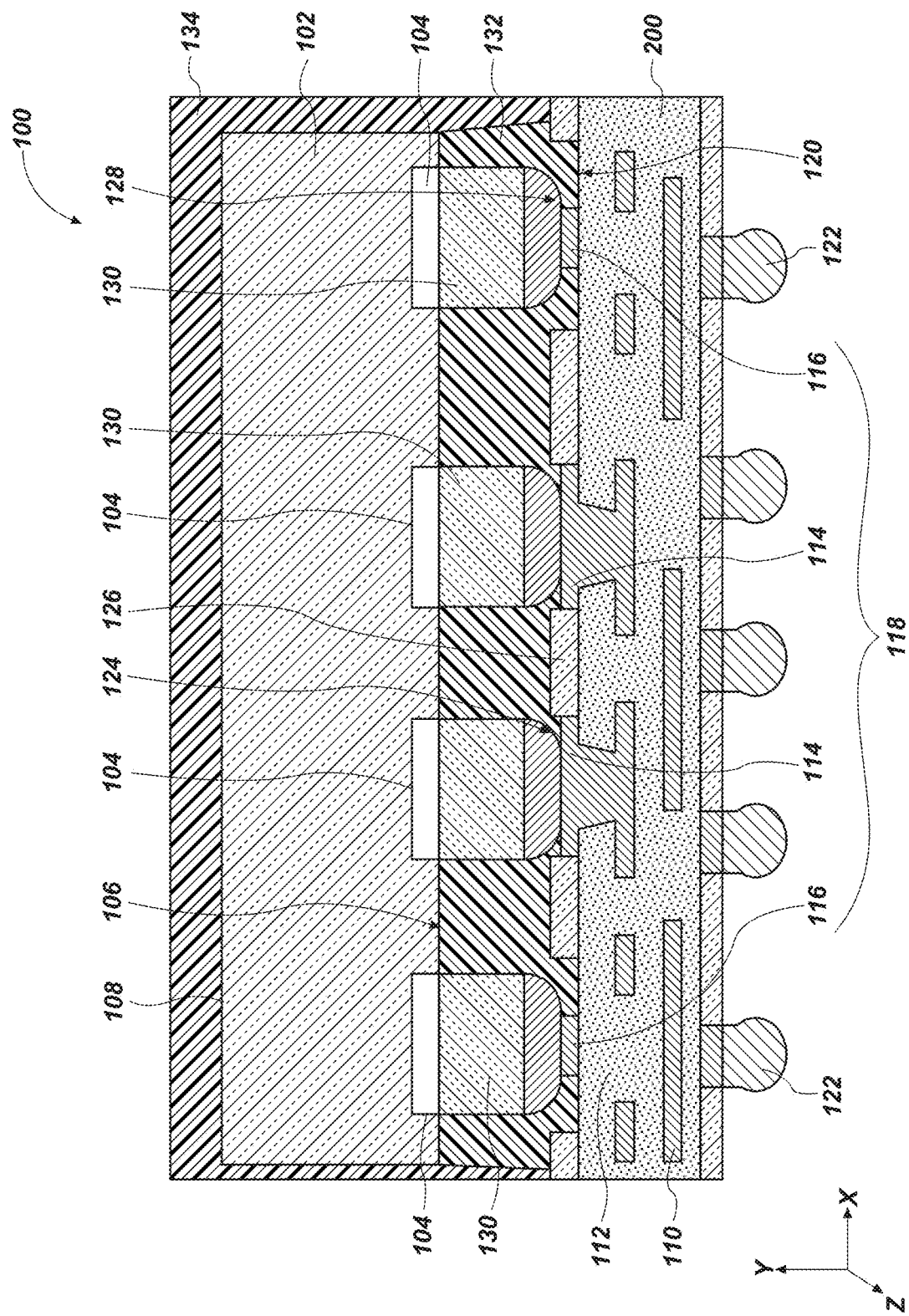
FIG. 1 is a cross-sectional side view of a microelectronic device package.

The illustrations presented in this disclosure are not meant to be actual views of any particular microelectronic device, package, system, intermediate apparatus in a process of making a microelectronic device package, or component thereof, but are merely idealized representations employed to describe illustrative embodiments. Thus, the drawings are not necessarily to scale.

Disclosed embodiments relate generally to designs for, and techniques for forming, electrical connections within microelectronic device packages that may reduce the risk of delamination between materials within the microelectronic device packages, which may increase reliability and reduce the risk of failure. More specifically, disclosed are embodiments of microelectronic devices utilizing different types of electrical contacts in different regions, and/or for different operational connections, within a microelectronic device package. For example, one or more contacts having lateral borders at least partially defined by a masking material may be utilized to form connections between a microelectronic device and a package substrate or a redistribution layer proximate to a center of the microelectronic device and/or for connecting to a source of electrical power or electrical ground. Continuing the example, one or more contacts having lateral borders not defined by the masking material may be utilized to form connections between the microelectronic device and the package substrate or the redistribution layer proximate to a periphery of the microelectronic device and/or for connecting to data input and/or data output.

As the size of microelectronics decreases and is deployed at higher density, the pitch of electrical connections in at least some regions of a microelectronic device package decreases. When forming connection at such high density, there may be less room for electrically insulating materials. The packages may utilize the same design for electrical contacts, regardless of contact pitch. With such uniform contact design, a greater proportion of the footprint underlying a microelectronic device may consist of exposed, electrically conductive material of a package substrate or redistribution layer. An underfill material used to fill the space between the microelectronic device and the package substrate or the redistribution layer may have a weaker bond with the exposed electrically conductive material than it would have with a dielectric material, such as a masking material. The inventors have found that the combination of miniaturization and uniform contact design may lead to increased risk of failure. For example, there may be an increased risk of delamination between the underfill material and the electrically conductive material with which the underfill material is in contact. Delamination, and the propagation of cracks resulting from delamination, may be particularly likely due to thermal cycling and mismatch in coefficient of thermal expansion between the underfill material and the electrically conductive material. Package and contact designs as proposed in this disclosure, which may utilize different designs in different areas and/or for different operational connections, may increase the surface area of dielectric material for bonding to the underfill material, may enable tailoring of contact design to contact pitch, and may reduce the risk of delamination and failure resulting therefrom.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, at least about 99.9%, or 100% of the specified value.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. For example, these terms may include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis and an indicated "Y" axis. The height of a respective material or feature (e.g., structure) may be defined as a dimension in a vertical plane.

The term "masking material defined" (MMD), as used to describe an electrical contact herein, means and includes a mass of electrically conductive material in contact with, and having at least one border defined by, a masking material on one or more lateral sides of the mass of electrically conductive material. For example, an MMD contact, when viewed in a plan view, will have a mass electrically conductive material in contact with, and having at least one border (e.g., boundary) at least partially defined by, a masking material above, below, to the left, or to the right of the mass of electrically conductive material. Continuing the example, an MMD contact, when viewed in a cross-sectional view taken in a plane perpendicular to a major surface of a package substrate or redistribution layer of which the MMD contact is a part and with the major surface facing upward, will have masking material to the left, to the right, or to the left and to the right in at least one rotation of the cross-sectional plane. Dielectric material of the package substrate or redistribution layer may underlie, and underfill material may cover surfaces of, the MMD contact and adjacent masses of masking material at least partially defining the MMD contact in such a cross-sectional view.

The term "non-masking material defined" (NMMD), as used to describe electrical contacts herein, means and includes a mass of electrically conductive material free from, and having no borders defined by, a masking material on the lateral sides of the mass of electrically conductive material. For example, a mass of electrically conductive material of an NMMD contact, when viewed in a plan view, will not be in contact with, and have no borders (e.g., boundaries) at least partially defined by, a masking material above, below, to the left, or to the right of the mass of electrically conductive material. Continuing the example, an NMMD contact, when viewed in a cross-sectional view taken in a plane perpendicular to a major surface of a package substrate or redistribution layer of which the NMMD contact is a part and with the major surface facing upward, will have no masking material to the left and to the right in each rotation of the cross-sectional plane. Dielectric material of the package substrate or the redistribution layer may underlie, and underfill material may cover surfaces of, the NMMD contact in such a cross-sectional view.

The terms "memory" and "memory device," as used herein, include microelectronic devices exhibiting, but not limited to, memory functionality, and exclude embodiments encompassing transitory signals. By way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), a microelectronic device combining logic and memory, and a graphics processing unit (GPU) incorporating. Memory devices may generally include packaged microelectronic devices having configurations for electrical contacts as described herein, unless otherwise specified.

FIG. 1 is a cross-sectional side view of a microelectronic device package 100. The microelectronic device package 100 may include, for example, a microelectronic device 102 supported on, and electrically connected to, a package substrate 200 or a redistribution layer. For the sake of convenience and simplicity, the structure of FIG. 1 will be referred to as a package substrate 200; however, the description of the package substrate 200 applies equally to a redistribution layer, and the package substrate 200 may be replaced with or referred to as a redistribution layer. The package substrate 200 may include contacts electrically connected to bond pads 104 of the microelectronic device 102 route and redistribute electrical connections to and from the microelectronic device 102 to facilitate connection to higher-level packaging (e.g., to a motherboard).

The microelectronic device 102 may include an active surface 106 having integrated circuitry embedded therein and/or formed and supported thereon. The bond pads 104 may be located at the active surface 106. The active surface 106 of the microelectronic device 102 may be located proximate to, and may face toward, the package substrate 200. The microelectronic device 102 may also include an inactive surface 108 located on a side of the microelectronic device 102 opposite the package substrate 200. The inactive surface 108 may lack integrated circuitry. The microelectronic device 102 may include, for example, a die of semiconductor material, selectively doped to form integrated circuitry at or on the active surface 106. In some embodiments, the microelectronic device 102 may be configured as a memory device or a logic controller for a memory device.

The package substrate 200 may include selectively positioned quantities of electrically conductive material 110 and dielectric material 112 to route electrical connections to and from the microelectronic device 102. The package substrate 200 may include contacts 118 including the electrically conductive material 110 for electrically and physically connecting to the microelectronic device 102. For example, the contacts 118 may be located at, and supported on, a major surface 120 of the package substrate 200 proximate to, and facing toward, the microelectronic device 102. The package substrate 200 may also include conductive elements 122, such as, for example, masses of solder (e.g., balls, bumps, pillars, coins), located on a side of the package substrate 200 opposite the microelectronic device 102. The electrically conductive material 110 of the package substrate 200 may route electrical connections from the conductive elements 122, through the package substrate 200, to the contacts 118 and to the bond pads 104 of the microelectronic device 102 connected thereto.

A first electrical connection 124 between the microelectronic device 102 and the package substrate 200 may be formed by a masking material defined (MMD) contact 114 located in a first region of the package substrate 200. For example, the package substrate 200 may include a masking material 126 located on the major surface 120 of the package substrate 200, and a portion of the masking material 126 may be located adjacent to the MMD contact 114, and may be in contact with a portion of an electrically conductive material 110 of the MMD contact 114, in the first region. In some embodiments, portions of the masking material 126 may be located adjacent to, and may be in contact with portions of electrically conductive material 110 of, several MMD contacts 114 in the first region. More specifically, a greater proportion of the masking material 126 may be concentrated in those regions having MMD contacts 114, which may include one or more first regions, located on the major surface 120 of the package substrate 200 and within the footprint of the microelectronic device 102.

The masking material 126 may include a dielectric material located on the major surface 120 of the package substrate 200. The dielectric material of the masking material 126 may be selectively removable, both to enable formation of some or all of the contacts 118 supported on the major surface 120 and to enable subsequent exposure of some portions of at least some of the contacts 118. For example, the masking material 126 may be placed over the major surface 120, portions of the masking material 126 may be removed where contacts 118 are to be formed, and electrically conductive material 110 of the contacts 118 may be positioned (e.g., plated, deposited by sputtering) in the voids where masking material 126 was removed. Subsequently, some of the masking material 126 may be removed from the major surface 120, including from locations where the masking material 126 was previously adjacent to, and in contact with, electrically conductive material 110 of one or more of the contacts 118. When forming MMD contacts 114, the masking material 126 may not be removed, may remain in contact with, and may define a border against at least one lateral side of each of the MMD contact 114. In some such examples, the masking material 126 may completely surround a given MMD contact 114. In other such examples, the masking material 126 may partially surround a given MMD contact 114. In some examples, the masking material 126 may include a photoresist material.

A second electrical connection 128 between the microelectronic device 102 and the package substrate 200 may be formed by a non-masking material defined (NMMD) contact 116 located in a second, different region of the package substrate 200. For example, any remaining portions of the masking material 126 may not be in contact with, and may be located distal from, the NMMD contact 116 in the second region. More specifically, no portion of the masking material 126 may be located adjacent to, and no portion of the masking material 126 may be in contact with, portions of electrically conductive material 110 of, several NMMD contacts 116 in the second region. As a specific, nonlimiting example, a lesser proportion of the masking material 126 may be located in those regions having NMMD contact 116, which may include one or more second regions, located on the major surface 120 of the package substrate 200 and within the footprint of the microelectronic device 102.

The NMMD contact 116 may include an elongated mass or a concentrated mass of electrically conductive material 110 extending over the major surface 120 of the package substrate 200, in some examples. For example, a given NMMD contact 116 may include a trace located on the major surface 120 of the package substrate 200. As another example, a given NMMD contact 116 may include a pad (e.g., a circle, a rectangle) located on the major surface 120 of the package substrate 200.

In some examples, other electrically conductive elements 130 may be interposed between, may electrically connect, and may affix the bond pads 104 of the microelectronic device 102 to the contacts 118 of the package substrate 200. For example, the other electrically conductive elements 130 may include masses of solder (e.g., balls, bumps, pillars, coins), located between the bond pads 104 and the contacts 118. More specifically, the other electrically conductive element 130 may include pillars of a first electrically conductive material (e.g., copper, gold, aluminum) in contact with and extending from the bond pads 104 and masses of a second, different electrically conductive material (e.g., solder) in contact with the pillars and the contacts 118. As a specific, nonlimiting example, the other electrically conductive elements 130 may include copper pillar bumps.

The microelectronic device package 100 may include an underfill material 132 interposed between the microelectronic device 102 and the package substrate 200 and configured to protect electrical connections between the microelectronic device 102 and the package substrate 200. For example, the underfill material 132 may be in contact with, and cover portions of, the MMD contacts 114, the NMMD contacts 116, the masking material 126, the major surface 120 of the package substrate 200, and the active surface 106 of the microelectronic device 102. The underfill material 132 may include, for example, a polymer material. The underfill material 132 may initially be in a flowable state, enabling the underfill material 132 to flow into otherwise unoccupied space between the microelectronic device 102 and the package substrate 200, and may subsequently be cured to fix the underfill material 132 in place.

The microelectronic device package 100 may include an encapsulant 134 to protect the microelectronic device 102. For example, the encapsulant 134 may be in contact with, and cover portions of, the microelectronic device 102, including the inactive surface 108, the underfill material 132, the major surface 120 of the package substrate 200, and the masking material 126 on the major surface 120 of the package substrate 200. The encapsulant 134 may include, for example, and polymer material. The polymer material of the encapsulant 134 may be different from, or the same as, the polymer material of the underfill material 132. The encapsulant 134 may initially be in a flowable state, enabling the encapsulant 134 to flow over and around the microelectronic device 102 and the package substrate 200, and may subsequently be cured to fix the encapsulant 134 in place.

Figure 2:
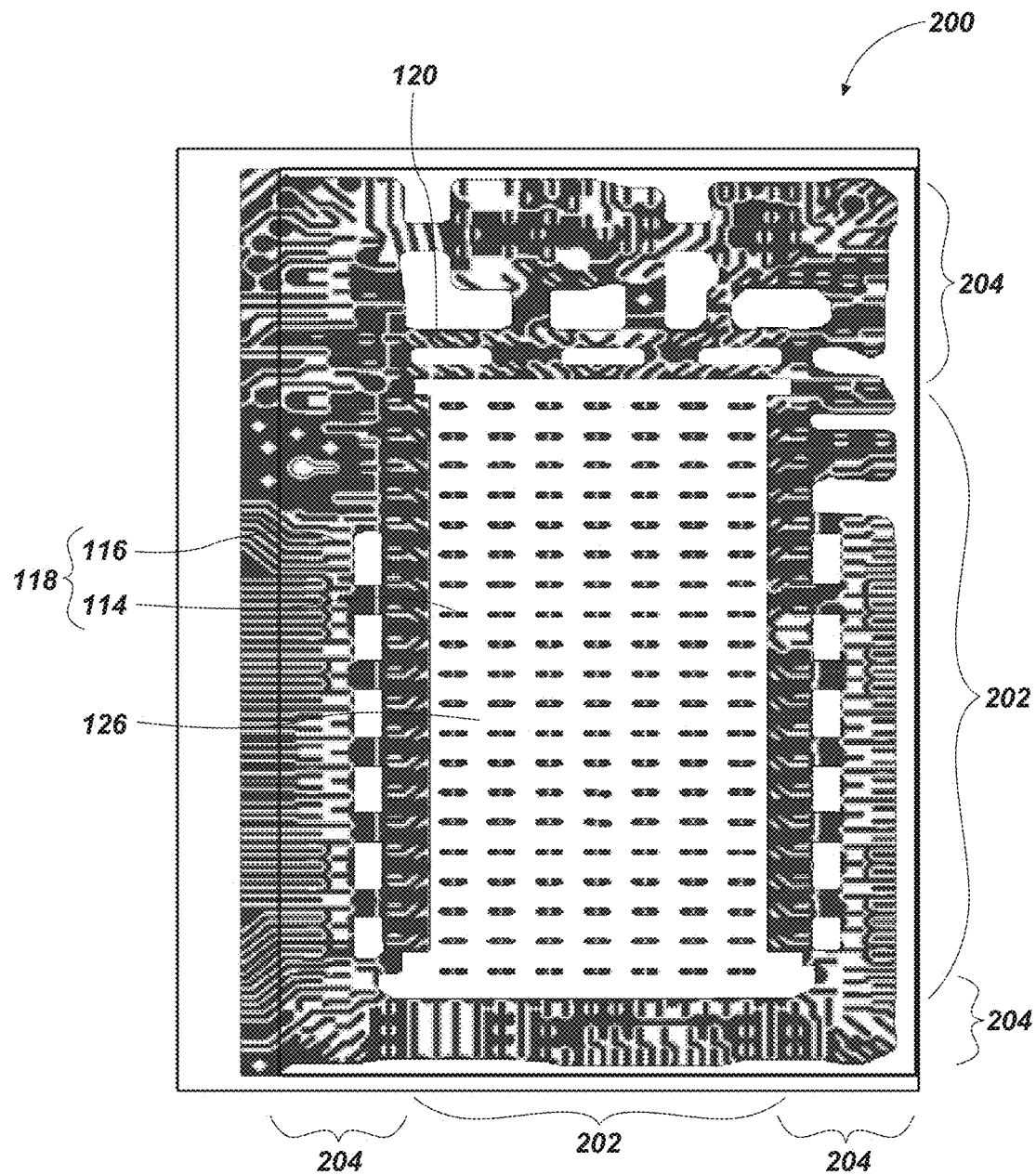
FIG. 2 is a surface plan view of a package substrate or a redistribution layer of the microelectronic device package of FIG. 1.

FIG. 2 is a surface plan view of a package substrate 200 or a redistribution layer of the microelectronic device package 100 of FIG. 1. In FIG. 2, the contacts 118, including MMD contacts 114 and NMMD contacts 116, and the masking material 126 on the major surface 120 of the package substrate 200 are shown. Again, the structure of FIG. 2 will be referred to as a package substrate 200; however, the description of the package substrate 200 applies equally to a redistribution layer, and the package substrate 200 may be replaced with or referred to as a redistribution layer. As shown in FIG. 2, the masking material 126 may cover, for example, between about 30% and about 50% of a surface area of the package substrate 200 within a footprint of the microelectronic device 102 (see FIG. 1). More specifically, the masking material 126 may cover, for example, between about 35% and about 45% of the surface area of the package substrate 200 within the footprint of the microelectronic device 102 (see FIG. 1). As a specific, nonlimiting example, the masking material 126 may cover between about 37% and about 42% (e.g., about 40%) of the surface area of the package substrate 200 within the footprint of the microelectronic device 102 (see FIG. 1). The proportions of the major surface 120 covered by the masking material 126, as enabled by the use of different designs for contacts 118 on the same package substrate 200, as disclosed herein may reduce the risk of delamination and failure.

A majority of contacts 118 of the package substrate 200 located proximate to a center of the package substrate 200 may be configured as MMD contacts 114, in some examples. For example, the first region 202 may be located at and around a geometric center of a footprint of the microelectronic device 102 (see FIG. 1) on the major surface 120, and most or all of the contacts 118 located within the first region 202 may be configured as MMD contacts 114. More specifically, the first region 202 may include, for example, a generally polygonal-shaped region, when viewed in a plan view, having a greater quantity of masking material 126 within the first region 202 than surrounding regions on the major surface 120 of the package substrate 200 and may have an array of MMD contacts 114, each of which may be at least partially surrounded by the masking material 126 within the first region 202. As a specific, nonlimiting example, the first region 202 may be a rectangular area on the major surface 120 of the package substrate 200 having an array of primarily or only MMD contacts 114 therein, and a correspondingly higher concentration of masking material 126 thereon when compared to surrounding regions.

In some examples, a majority of contacts 118 of the package substrate 200 located proximate to a periphery of the package substrate 200 may be configured as NMMD contacts 116. For example, the second region 204 may be located at and extend inwardly from a geometric periphery of a footprint of the microelectronic device 102 (see FIG. 1) on the major surface 120, may at least partially surround the first region 202, and most or all of the contacts 118 located within the second region 204 may be configured as NMMD contacts 116. More specifically, the second region 204 may include, for example, a generally frame- or partial-frame-shaped region, when viewed in a plan view, having a lesser quantity of masking material 126 within the second region 204 than more central regions on the major surface 120 of the package substrate 200 and may have an array of NMMD contacts 116, each of which may be free from contact with the masking material 126 at and proximate to locations where the NMMD contacts 116 will be electrically connected to the microelectronic device 102 (see FIG. 1). As a specific, nonlimiting example, the second region 204 may have a generally hollow rectangular shape surrounding the first region 202 on the major surface 120 of the package substrate 200 and may have an array of primarily or only NMMD contacts 116 therein, and a correspondingly lower concentration of masking material 126 on the major surface 120 within the second region 204 when compared to the first region 202 surrounded by the second region 204.

A pitch of contacts 118 of the package substrate 200 configured as MMD contacts 114 may be greater than or equal to about 110 µmicrometers (µm), in some examples. For example, an average center-to-center pitch of contacts 118 within the first region 202 may be within a range of from about 115 µm to about 400 µm. More specifically, the average center-to-center pitch of adjacent MMD contacts 114 on the major surface 120 of the package substrate 200 may be within a range of from about 120 µm to about 300 µm. As a specific, nonlimiting example, an average center-to-center pitch of adjacent MMD contacts 114 within the first region 202 on the major surface 120 of the package substrate 200 may be within a range of from about 125 µm to about 250 µm (e.g., about 150 µm, about 200 µm).

In some examples, a pitch of contacts of the package substrate 200 configured as NMMD contacts 116 may be less than about 110 µm. For example, an average center-to-center pitch of contacts 118 within the second region 204 may be within a range of from about 10 µm to about 105 µm. More specifically, the average center-to-center pitch of adjacent NMMD contacts 116 on the major surface 120 of the package substrate 200 may be within a range of from about 15 µm to about 100 µm. As a specific, nonlimiting example, an average center-to-center pitch of adjacent NMMD contacts 116 within the second region 204 on the major surface 120 of the package substrate 200 may be within a range of from about 20 µm and about 90 µm (e.g., about 25 µm, about 50 µm, about 75 µm).

Each contact 118 of the package substrate 200 configured to connect to a source of electrical power and/or electrical ground may be configured as an MMD contact 114, in some examples. For example, at least some of the contacts 118 located within the first region 202 may be positioned and configured to route connections to and/or from a source of electrical power and/or electrical ground, and those specific contacts 118 may be configured as MMD contacts 114. More specifically, those contacts 118 positioned and configured to route connections to and/or from a source of electrical power and/or electrical ground may be located exclusively within the first region 202 and may be configured as MMD contacts 114.

In some examples, a majority of contacts 118 of the package substrate 200 configured to connect to data input and/or data output may be configured as NMMD contacts 116. For example, a majority of the contacts 118 located within the second region 204 may be positioned and configured to route connections for data input and/or data output, and those specific contacts 118 may be configured as NMMD contact 116. More specifically, those contacts 118 positioned and configured to route connections for data input and/or data output may be located, for example, primarily within the second region 204 and may be configured as NMMD contacts 116. As a specific, nonlimiting example, those contacts 118 positioned and configured to route connections for data input and/or data output may be located, for example, exclusively within the second region 204 and may be configured as NMMD contacts 116.

In summary, microelectronic device packages in accordance with certain embodiments of this disclosure may include, for example, a microelectronic device supported on, and electrically connected to, one of a package substrate and a redistribution layer. A masking material defined (MMD) contact may be located in a first region of the one of the package substrate and the redistribution layer, the MMD contact facilitating a first electrical connection between the microelectronic device and the one of the package substrate and the redistribution layer. A non-masking material defined (NMMD) contact may be located in a second, different region of the one of the package substrate and the redistribution layer, the NMMD contact facilitating a second electrical connection between the microelectronic device and the one of the package substrate and the redistribution layer.

In additional embodiments, microelectronic device packages may include a microelectronic device supported on, and electrically connected to, one of a package substrate and a redistribution layer. A first array of masking material defined (MMD) contacts may be located in a central region of the one of the package substrate and the redistribution layer, the first array of MMD contacts facilitating first electrical connections between the microelectronic device and the one of the package substrate and the redistribution layer. A second array of non-masking material defined (NMMD) contacts may be located in a peripheral region of the one of the package substrate and the redistribution layer, the NMMD contacts facilitating second electrical connections between the microelectronic device and the one of the package substrate and the redistribution layer.

In other embodiments, microelectronic device packages may include a microelectronic device supported on, and electrically connected to, one of a package substrate and a redistribution layer. A first array of masking material defined (MMD) contacts may be located in a first region of the one of the package substrate and the redistribution layer, the first array of MMD contacts facilitating first electrical connections between the microelectronic device and the one of the package substrate and the redistribution layer. At least some of the first electrical connections may be positioned and configured for connecting to a source of at least one of electrical power and electrical ground. A second array of non-masking material defined (NMMD) contacts may be located in a second, different region of the one of the package substrate and the redistribution layer, the NMMD contacts facilitating second electrical connections between the microelectronic device and the one of the package substrate and the redistribution layer. At least some of the second electrical connections being positioned and configured for connecting to at least one of data input and data output.

Figure 3:
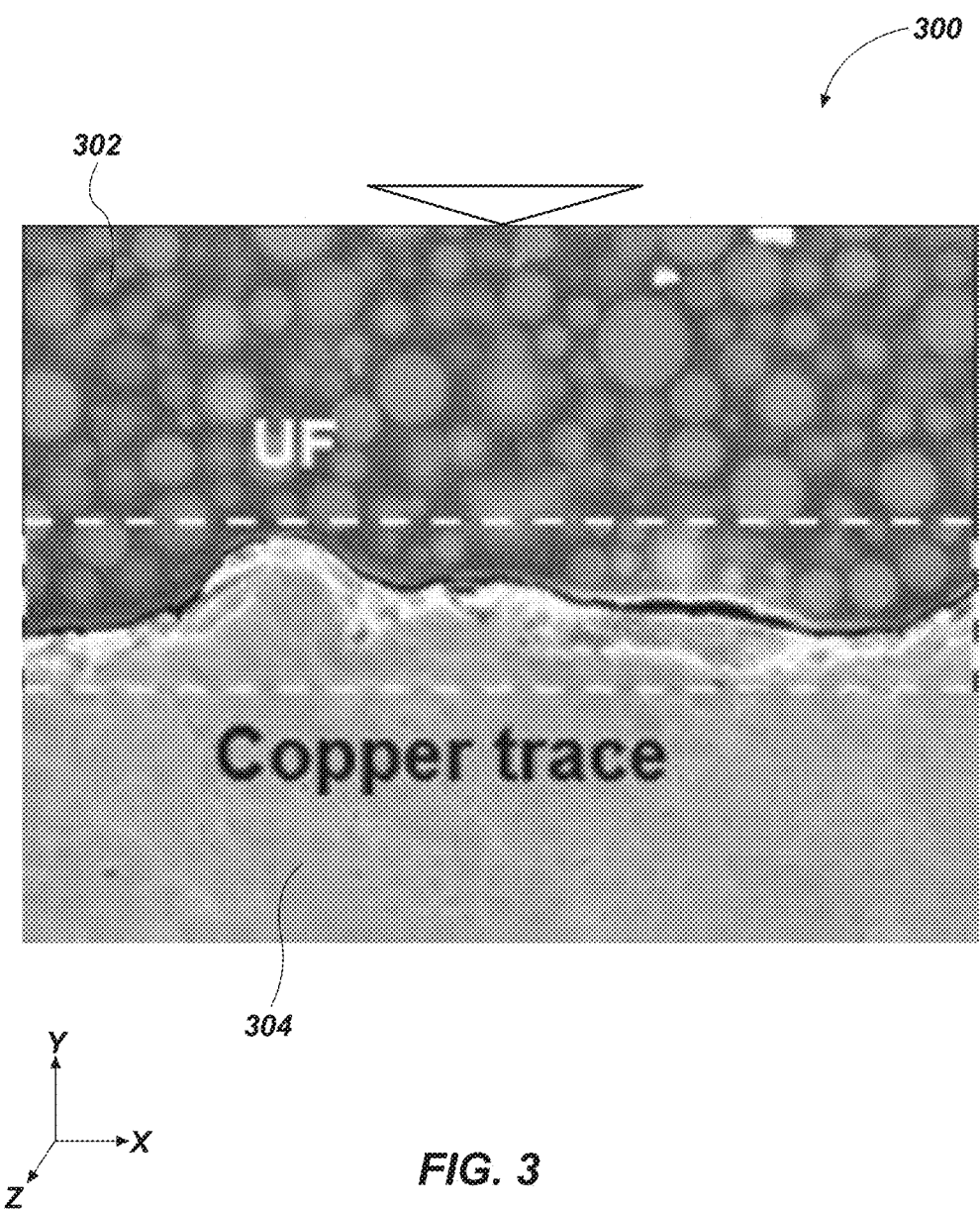
FIG. 3 is an enlarged, cross-sectional view of an interface between an underfill material and an electrically conductive material in a microelectronic device package known to the inventors.

FIG. 3 is an enlarged, cross-sectional view of an interface 300 between an underfill material 302 and an electrically conductive material 304 in a microelectronic device package known to the inventors. As shown in FIG. 3, direct contact between the underfill material 302 and the electrically conductive material 304 may increase the risk that the underfill material 302 and the electrically conductive material 304 may delaminate from one another. Specifically, the electrically conductive material 304 shown in FIG. 3 may be configured as a copper trace, and the underfill material 132 has become delaminated from the trace. Configurations for contacts, package substrates and/or redistribution layers, and packages in accordance with this disclosure may reduce direct contact between underfill material and electrically conductive material, and increase direct contact between underfill material and masking material, reducing the risk of delamination and failure.

Figure 4:
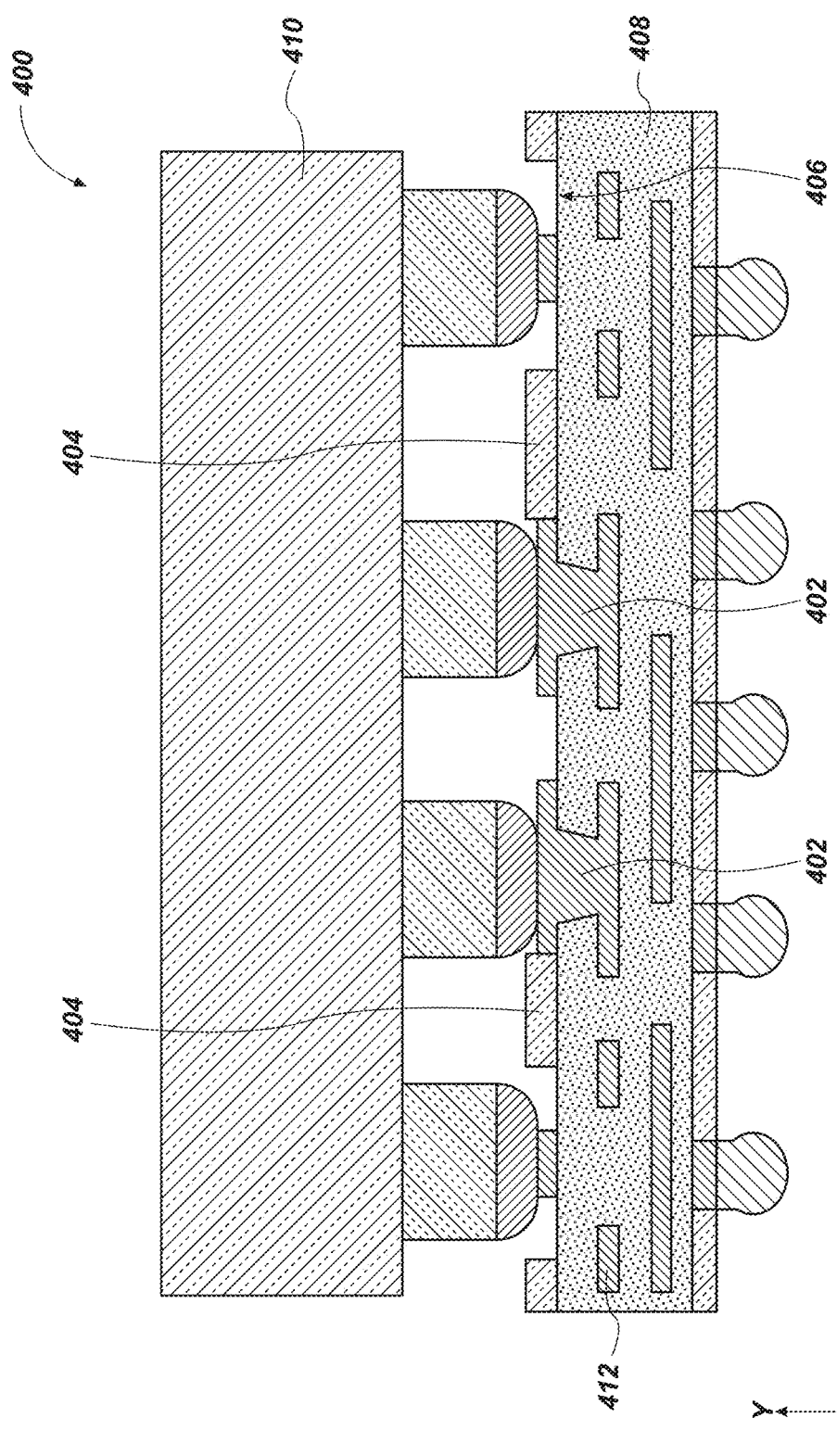
FIG. 4 is a cross-sectional side view of another embodiment of a microelectronic device package.

FIG. 4 is a cross-sectional side view of another embodiment of a microelectronic device package 400. The microelectronic device package 400 may be at least substantially similar to the microelectronic device package 100 of FIG. 1. The omission of the underfill material and the encapsulant in FIG. 4 is primarily for the sake of convenience and simplicity. Packages configured in accordance with the microelectronic device package 400 of FIG. 4 may likewise include underfill material and encapsulant. Features which may differ from those of the microelectronic device package 100 of FIG. 1 are highlighted below.

At least one lateral side of at least one MMD contact 402 within the microelectronic device package 400 may be free of masking material 404 on at least one lateral side of the MMD contact 402 in some examples. For example, a given MMD contact 402 on the major surface 406 of the package substrate 200 facing toward the microelectronic device 410 may have masking material 404 in contact with, and defining a border with, an electrically conductive material 412 of the MMD contact 402 on a first lateral side of the MMD contact 402, and may be free of contact with the masking material 404 on a second, different lateral side of the MMD contact 402. More specifically, some MMD contacts 402 located on the package substrate 408 may have masking material 404 in contact with one or more lateral sides of the electrically conductive material 304 of those MMD contacts 402 and may be free of masking material 404 on one or more other lateral sides of the electrically conductive material 304 of those MMD contacts 402. As a specific, nonlimiting example, at least two adjacent MMD contacts 402 of the package substrate 408 may have masking material 404 on opposite, outer lateral sides of those MMD contacts 402, and may be free of contact with masking material 404 on proximate lateral sides of those MMD contact 402 facing one another, such that no masking material 404 may be interposed between the adjacent MMD contacts 402.

In some embodiments where the MMD contacts 402 lacking masking material 404 on at least one lateral side are adjacent to one another, those two adjacent MMD contacts 402 of the package substrate 408 may be electrically connected to one another. For example, those adjacent MMD contacts 402 lacking masking material 404 interposed between the adjacent MMD contacts 402 may be positioned, and electrically conductive material 412 of the package substrate 408 may route electrical connections, to a source of electrical power or electrical ground. Electrically connecting adjacent MMD contacts 402 to one another within the package substrate 408 may reduce the risk that an unintended connection resulting from drift of solder, and not impeded by masking material 404 between the MMD contacts 402, would impede operation of the microelectronic device package 400.

Omitting masking material 404 between adjacent MMD contacts 402 may enable use of MMD contact 402 designs in situations where the pitch between adjacent MMD contacts 402 is small. For example, the center-to-center pitch of MMD contacts 402 lacking masking material 404 between the MMD contacts 402 may be less than about 110 µm. More specifically, the center-to-center pitch of MMD contacts 402 lacking masking material 404 between the MMD contacts 402 may be, for example, within a range of from about 20 µm to about 100 µm. As a specific, nonlimiting example, the center-to-center pitch of MMD contacts 402 lacking masking material 404 between the MMD contacts 402 may be within a range of from about 25 µm to about 75 µm (e.g., about 50 µm).

Figure 5:
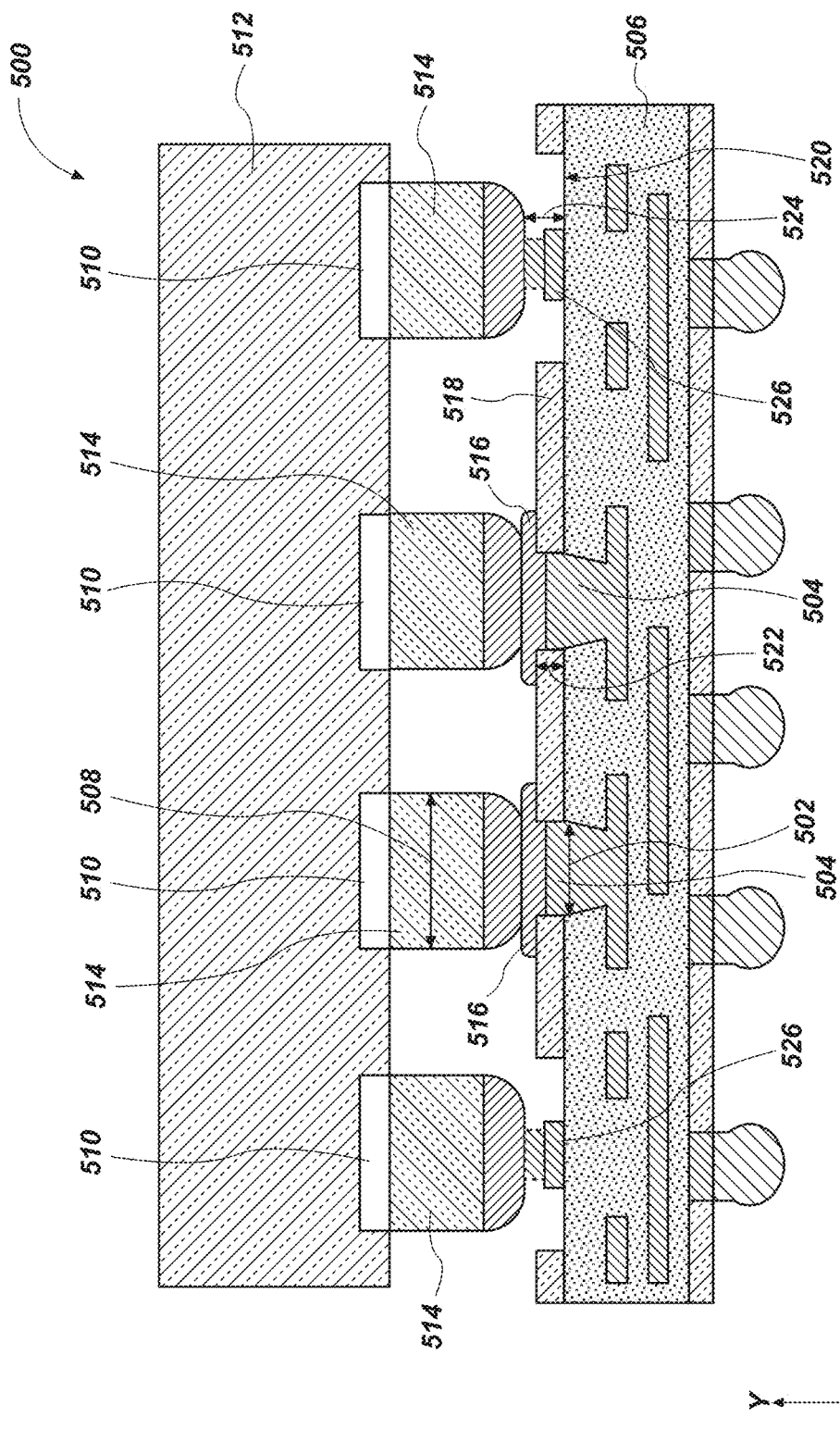
FIG. 5 is a cross-sectional side view of another embodiment of a microelectronic device package.

FIG. 5 is a cross-sectional side view of another embodiment of a microelectronic device package 500. The microelectronic device package 400 may be at least substantially similar to the microelectronic device package 100 of FIG. 1. The omission of the underfill material and the encapsulant in FIG. 5 is primarily for the sake of convenience and simplicity. Packages configured in accordance with the microelectronic device package 500 of FIG. 5 may likewise include underfill material and encapsulant. Features which may differ from those of the microelectronic device package 100 of FIG. 1 are highlighted below.

In some examples, a greatest diameter 502 of one or more MMD contacts 504 of the package substrate 506 or redistribution layer may be less than a greatest diameter 508 of a bond pad 510 of the microelectronic device 512 adjacent to the MMD contact 504. For example, the size of the MMD contacts 504 may be reduced to enable deployment of the MMD contacts 504 at a smaller pitch.

To enable the electrically conductive elements 514 to make contact with the MMD contacts 504, supplemental quantities of a reflowable, electrically conductive material 516 may be positioned between the electrically conductive elements 514 and the MMD contacts 504. For example, the electrically conductive elements 514 to be connected to the MMD contacts 504 may be brought in contact with the reflowable, electrically conductive material 516 on the MMD contacts 504, rather than being placed in direct contact with the MMD contacts 504 themselves.

After reflow to secure the electrical and physical connection, the reflowable, electrically conductive material 516 may occupy a space between an upper surface of the MMD contacts 504 (when viewed in the cross-section and orientation of FIG. 5) and an upper surface of the masking material 518 on the major surface 520 of the package substrate 506. For example, the distance between the upper surface of the MMD contacts 504 and the upper surface of the masking material 518 may be within a range of from about 5 µm to about 15 µm (e.g., about 10 µm), and the reflowable, electrically conductive material 516 may at least substantially completely occupy the space therebetween.

In some examples, the reflowable, electrically conductive material 516 may extend above the upper surface of the MMD contacts 504. For example, a quantity of the reflowable, electrically conductive material 516 for each MMD contacts 504 may be sufficient to occupy the volume of space between the upper surface of the MMD contact 504 and the upper surface of the masking material 518, with sufficient excess reflowable, electrically conductive material 516 to extend beyond that volume. More specifically, the reflowable, electrically conductive material 516 may extend within a range of from about 2 µm to about 10 µm (e.g., about 5 µm, about 7 µm) above the upper surface of the masking material 518.

A first thickness 522 of an MMD contact 504 of the package substrate 506, as measured from the major surface 520 of the package substrate 506 in a direction perpendicular to the major surface 520 of the package substrate 506, is less than a second thickness 524 of an NMMD contact 526 of the package substrate 506, as measured from the major surface 520 in the direction perpendicular to the major surface 520. For example, the second thickness 524 of some or all of the NMMD contacts 526 may be increased to match the height of the reflowable, electrically conductive material 516 on any MMD contacts 504 including that reflowable, electrically conductive material 516. More specifically, the second thickness 524 of those NMMD contacts 526 matching the height of the reflowable, electrically conductive material 516 above the major surface 520 of the package substrate 506 may be, for example, be within a range of from about 10 µm to about 20 µm (e.g., about 15 µm). To achieve the second thickness 524, additional electrically conductive material may be provided during or after formation of the NMMD contacts 526. For example, the additional electrically conductive material may be provided by plating or sputtering.

Figure 6:
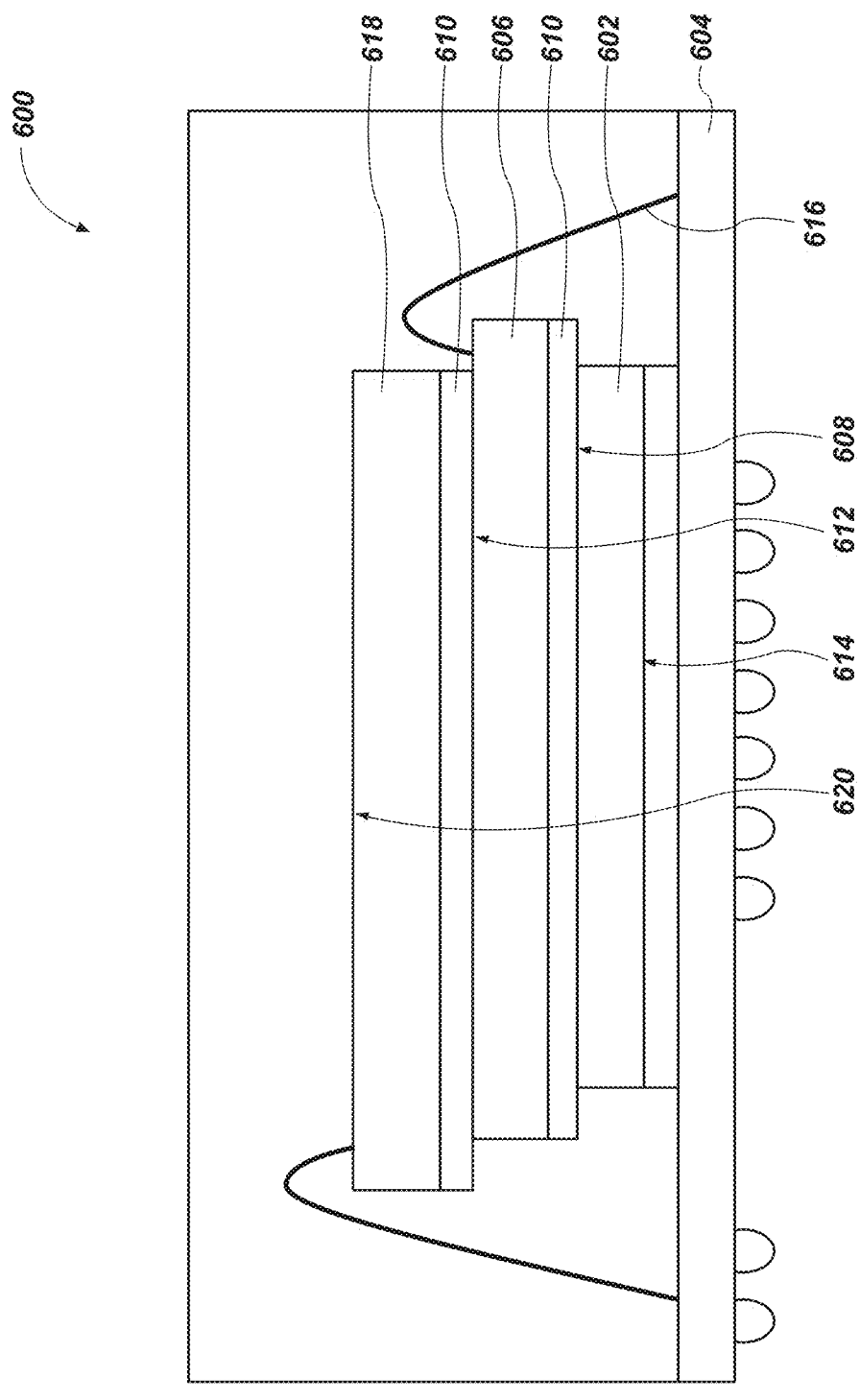
FIG. 6 is a cross-sectional side view of another embodiment of a microelectronic device package.

FIG. 6 is a cross-sectional side view of another embodiment of a microelectronic device package 600. The microelectronic device package 600 may be at least substantially similar to the microelectronic device package 100 of FIG. 1. For example, the 600 may include a first microelectronic device 602 supported on, and electrically connected to, a package substrate 604 or a redistribution layer. The contacts between the first microelectronic device 602 and the package substrate 604, which are not depicted for the sake of simplicity, may include one or more MMD contacts 114 (see FIG. 1) and one or more NMMD contacts 116, as described hereinabove.

The microelectronic device package 600 of FIG. 6 may include one or more additional microelectronic devices located on a side of the first microelectronic device 602 opposite the package substrate 604. For example, the microelectronic device package 600 may include a second microelectronic device 606 supported on an inactive surface 608 of the first microelectronic device 602. More specifically, the second microelectronic device 606 may be stacked on the first microelectronic device 602 on a side of the first microelectronic device 602 opposite the package substrate 604 with a dielectric material 610 interposed between the first microelectronic device 602 and the second microelectronic device 606.

In some examples, a second active surface 612 of the second microelectronic device 606 may face away from the first microelectronic device 602. For example, the second active surface 612 of the second microelectronic device 606, which may include circuitry embedded therein and/or formed and supported thereon, may be located on a side of the second microelectronic device 606 opposite the first microelectronic device 602. More specifically, the second active surface 612 of the second microelectronic device 606 and a first active surface 614 of the first microelectronic device 602 may be located on sides of the respective first microelectronic device 602 and second microelectronic device 606 that are opposite one another, such that the second active surface 612 and the first active surface 614 face away from one another.

A footprint of the second microelectronic device 606 may be, for example, larger than a footprint of the first microelectronic device 602. More specifically, at least one peripheral side of the second microelectronic device 606 may overhang, extending beyond, a corresponding peripheral side of the first microelectronic device 602. As a specific, nonlimiting example, the second microelectronic device 606 may be, for example, at least substantially centered over the first microelectronic device 602 in at least one cross-sectional view, and at least two peripheral sides of the second microelectronic device 606 may overhang, extending beyond, the corresponding peripheral sides of the first microelectronic device 602.

The second microelectronic device 606 may be electrically connected to the package substrate 604 or redistribution layer. For example, wire bonds 616 may be in contact with, and extend between, bond pads exposed along one peripheral side of the second microelectronic device 606 and lands located on a major surface of the package substrate 604 or redistribution layer facing toward the second microelectronic device 606.

One or more yet additional microelectronic devices may be located on a side of the second microelectronic device 606 opposite the first microelectronic device 602, forming a larger stack. For example, the microelectronic device package 600 may include a third microelectronic device 618 supported on the second active surface 612 of the second microelectronic device 606. More specifically, the third microelectronic device 618 may be stacked on the second microelectronic device 606 on a side of the second microelectronic device 606 opposite the first microelectronic device 602 with a dielectric material 610 interposed between the third microelectronic device 618 and the second microelectronic device 606. The quantities of the dielectric material 610 may be at least substantially the same as, or different from, one another in terms of specific material, thickness, and other characteristics. Though two additional microelectronic devices are shown stacked on the first microelectronic device 602 in FIG. 6, more or fewer devices may be stacked on the lowest microelectronic device in accordance with this disclosure. For example, the number of microelectronic devices stacked on the lowest microelectronic device may be one, four, eight, or any number therebetween.

In some examples, a third active surface 620 of the third microelectronic device 618 may face away from the second microelectronic device 606. For example, the third active surface 620 of the third microelectronic device 618, which may include circuitry embedded therein and/or formed and supported thereon, may be located on a side of the third microelectronic device 618 opposite the second microelectronic device 606. More specifically, the third active surface 620 of the third microelectronic device 618 and the second active surface 612 of the second microelectronic device 606 may be located on sides of the respective third microelectronic device 618 and second microelectronic device 606 that face in the same direction, away from the package substrate 604 or redistribution layer.

A footprint of the third microelectronic device 618 may be, for example, larger than a footprint of the first microelectronic device 602. More specifically, at least one peripheral side of the third microelectronic device 618 may overhang, extending beyond, a corresponding peripheral side of the first microelectronic device 602. As a specific, nonlimiting example, the footprint of the third microelectronic device 618 may be, for example, at least substantially equal to the foot print of the second microelectronic device 606, the third microelectronic device 618 may be offset relative to center over the first microelectronic device 602 in at least one cross-sectional view, at least one peripheral side of the second microelectronic device 606 may extend beyond, the corresponding peripheral side of the third microelectronic device 618 (forming a stair step configuration), and an opposite peripheral side of the third microelectronic device 618 may extend beyond the corresponding peripheral sides of the first microelectronic device 602 and the second microelectronic device 606.

The third microelectronic device 618 may be electrically connected to the package substrate 604 or redistribution layer. For example, wire bonds 616 may be in contact with, and extend between, bond pads exposed along one peripheral side of the third microelectronic device 618 and lands located on a major surface of the package substrate 604 or redistribution layer facing toward the third microelectronic device 618. The wire bonds 616 extending to the third microelectronic device 618 may be located on a side of the microelectronic device 606 opposite a side on which the wire bonds 616 extending to the second microelectronic device 606 are located.

In some examples, the microelectronic device package 600 of FIG. 6 may be configured as a memory module. For example, the first semiconductor device 602 may be configured as a logic controller for a memory module, and the second semiconductor device 606 and the third semiconductor device 618 may be configured as memory devices. More specifically, the first semiconductor device 602 may be configured as an application-specific integrated circuit (ASIC) for controlling memory devices and the second semiconductor device 606 and the third semiconductor device 618 may be configured as NAND memory devices.

Where logically possible, the features of the microelectronic device package 100 of FIG. 1 may be replaced, or combined, with those of the microelectronic device package 400 of FIG. 4, those of the microelectronic device package 500 of FIG. 5, and/or those of the microelectronic device package 600 of FIG. 6. For example, one or more of the contacts 118 of the microelectronic device package 100 FIG. 1 may be configured as MMD contacts 402 lacking masking material 404 on one or more lateral sides, and optionally between adjacent MMD contacts 402, as shown in FIG. 4. As another example, one or more of the contacts 118 of the microelectronic device package 100 of FIG. 1 may be configured as an MMD contact 504 having a smaller diameter than the associated bond pad 510 and may include supplemental, reflowable, electrically conductive material 516 thereon, as shown in FIG. 5. As another example, one or more of the contacts 118 of the microelectronic device package 100 of FIG. 1 may be configured as an NMMD contact 526 having increased thickness, as shown in FIG. 5. As another example, the microelectronic device package 100 of FIG. 1 may include multiple stacked microelectronic devices 602, 606, 618, as shown in FIG. 6. As another example, the microelectronic device package 100 of FIG. 1 may include any combination or subcombination of these features for different instances of the contacts 118 and/or microelectronic device(s) 602, 606, 618 within the microelectronic device package 100.

Figure 7:
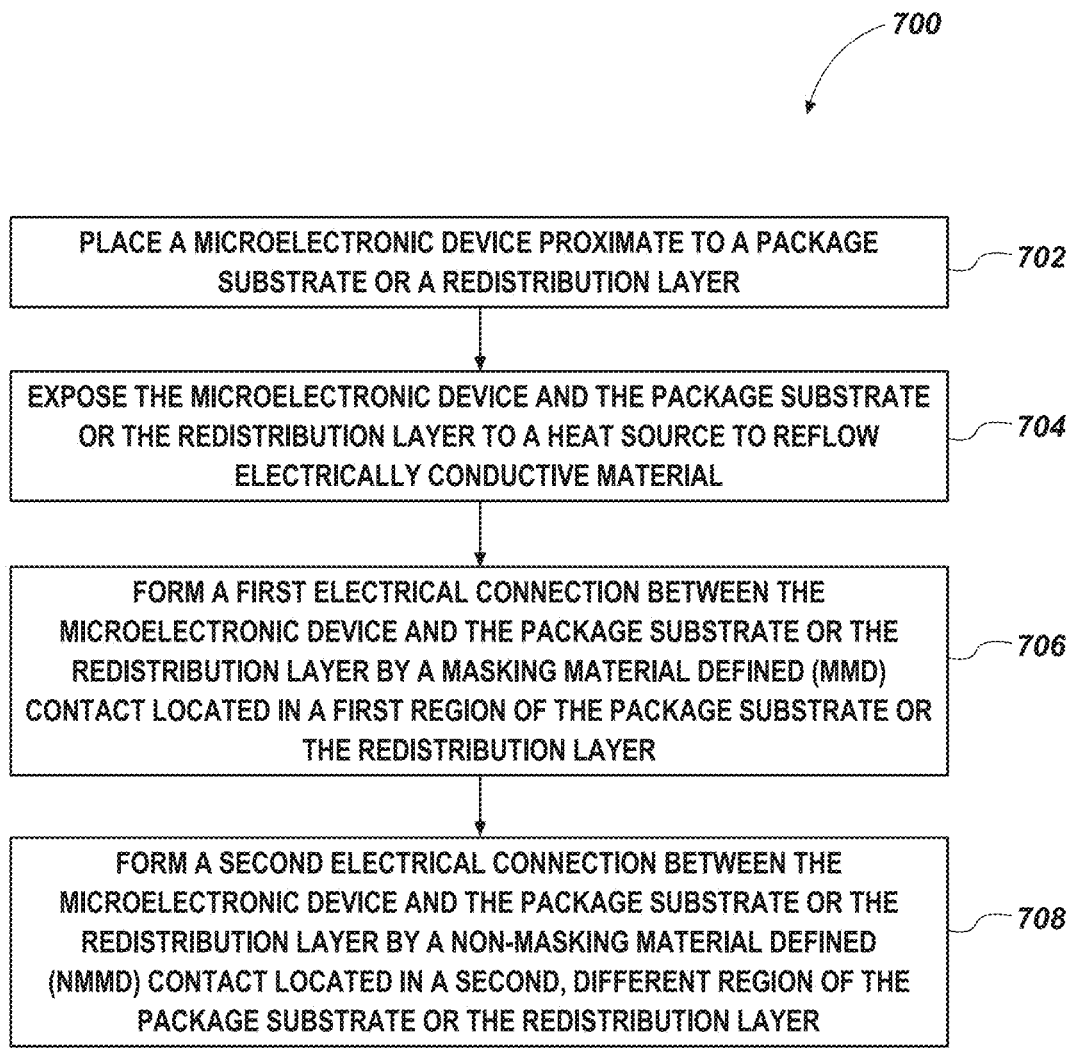
FIG. 7 is a flowchart illustrating a method of making a microelectronic device package.

FIG. 7 is a flowchart illustrating a method 700 of making a microelectronic device package in accordance with this disclosure. The method 700 may involve, for example, placing a microelectronic device proximate to a package substrate or a redistribution layer, as indicated at act 702. The microelectronic device and the package substrate or the redistribution layer may be exposed to a heat source to reflow electrically conductive material, as shown at act 704. Reflow of the electrically conductive material may form, for example, a first electrical connection between the microelectronic device and the package substrate or the redistribution layer, as indicated at act 706. The first electrical connection may be formed by a masking material defined (MMD) contact located in a first region of the package substrate or the redistribution layer, as also indicated at act 706.

Reflow of the electrically conductive material may also form, for example, a second electrical connection between the microelectronic device and the package substrate or the redistribution layer, as indicated at act 708. The second electrical connection may be formed by a non-masking material defined (NMMD) contact located in a second, different region of the package substrate or the redistribution layer, as also indicated at act 708.

In some examples, the method 700 may further involve placing a masking material on a major surface of the package substrate or the redistribution layer. The masking material may be left in contact with one or more lateral sides of a mass of electrically conductive material of the MMD contact to at least partially define the MMD contact. For example, the masking material may be placed on the major surface by spin coating or silkscreening, followed by a curing process, and the masking material may be selectively removed by photolithography or etching.

The method 700 may also involve removing the masking material from around the NMMD contact, in some examples. The NMMD contact may be left free of contact with a material of the masking material at and proximate to the second region as a result. Removal of the masking material may involve a photolithography or etching process.

In some examples, the masking material may be left to cover between about 30 percent (%) and about 50% of a surface area of the package substrate or the redistribution layer within a footprint of the microelectronic device. For example, a design of the contacts of the package substrate or the redistribution layer may include a sufficient number of the MMD contacts to ensure that such a percentage of the surface area of the package substrate or the redistribution layer can include the masking material thereon, while still including at least one NMMD contact.

Placing the microelectronic device proximate to the package substrate or the redistribution layer may involve, for example, placing copper pillar bumps of the microelectronic device in contact with contacts of the package substrate or the redistribution layer, including the MMD contact and the NMMD contact. More specifically, each bond pad of the microelectronic device may have a copper pillar bump thereon, and those copper pillar bumps may be brought proximate to, and/or in contact with, contacts of the package substrate or the redistribution layer, such as, for example, using a pick-and-place machine.

Figure 8:
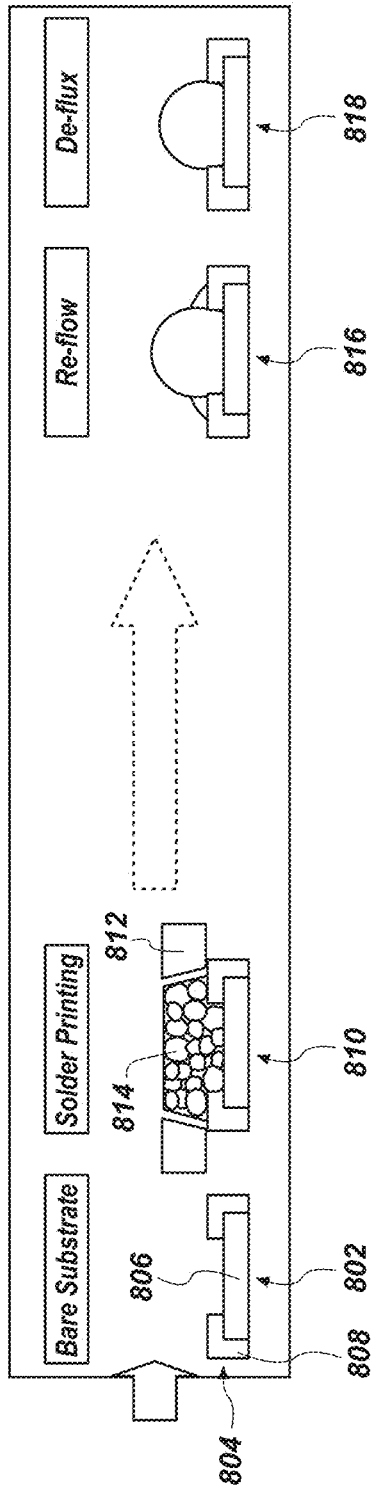
FIG. 8 is a schematic illustrating certain acts in one embodiment of a method of making a microelectronic device package.

FIG. 8 is a schematic illustrating certain acts in one embodiment of a method of making a microelectronic device package. In some examples, reflowable, electrically conductive material may be placed on the contacts of the package substrate 804 or the redistribution layer, on the bond pads of the microelectronic device, on the copper pillar bumps, or on any combination of these by a printing process. In an example where the reflowable, electrically conductive material is placed on the contacts of the package substrate or the redistribution layer, a package substrate 804 or redistribution layer having preformed contacts may be provided, as shown in a first stage 802 of FIG. 7. In embodiments where the contact is an MMD contact 806, masking material 808 may be in contact with one or more lateral sides of an electrically conductive material of the MMD contact 806.

In a second stage 810 of the process, a stencil 812 having openings selectively positioned to enable a reflowable, electrically conductive material 814 to pass through the stencil 812 and onto contacts of the package substrate 804 may be brought proximate to the package substrate 804. One or more quantities of the reflowable, electrically conductive material 814 may be placed on a side of the stencil 812 opposite the package substrate 804, and the reflowable, electrically conductive material 814 may be urged through the openings in the stencil 812 and onto the contacts, including the MMD contacts 806. The reflowable, electrically conductive material 814 may include, for example, small particles of solder material in a flux binder. The stencil 812 may then be removed, leaving the reflowable, electrically conductive material 814 on the contacts.

In a third stage 816 of the process, the reflowable, electrically conductive material 814 may be reflowed, such that discrete, contiguous masses of the reflowable, electrically conductive material 814 may be located on each contact. Reflow may involve exposing the reflowable, electrically conductive material 814 to a source of heat, such as, for example, a laser, oven, or furnace. In an optional fourth stage 818 of the process, flux may be removed from the contacts, such as, for example, utilizing a solvent.

Figure 9:
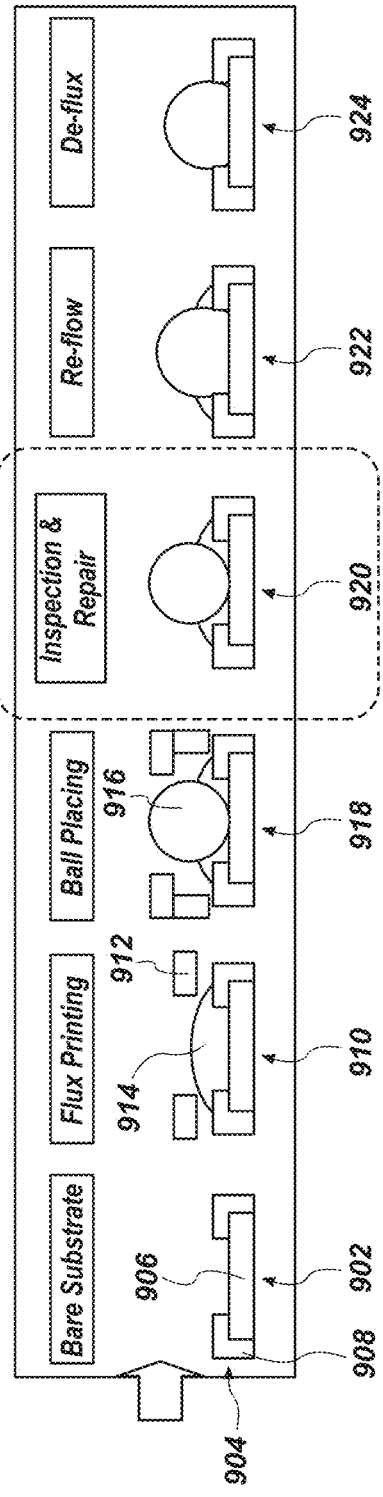
FIG. 9 is a schematic illustrating certain acts in another embodiment of a method of making a microelectronic device package.

FIG. 9 is a schematic illustrating certain acts in another embodiment of a method of making a microelectronic device package. In some examples, preformed masses of reflowable, electrically conductive material may be provided on the contacts of the package substrate 804 or the redistribution layer, on the bond pads of the microelectronic device, on the copper pillar bumps, or on any combination of these by a placement process. In an example where the masses are placed on the contacts of the package substrate or the redistribution layer, a package substrate 904 or redistribution layer having preformed contacts may be provided, as shown in a first stage 902 of FIG. 9. In embodiments where the contact is an MMD contact 906, masking material 908 may be in contact with one or more lateral sides of an electrically conductive material of the MMD contact 906.

In a second stage 910 of the process, a stencil 912 having openings selectively positioned to enable flux 914 to pass through the stencil 912 and onto contacts of the package substrate 904 may be brought proximate to the package substrate 904. One or more quantities of the flux 914 may be placed on a side of the stencil 912 opposite the package substrate 904, and the flux 914 may be urged through the openings in the stencil 912 and onto the contacts, including the MMD contacts 906. In a third stage 918 of the process, preformed, discrete masses 916 of the reflowable, electrically conductive material may be placed on the flux 914. The stencil 912 may then be removed, leaving the preformed, discrete masses of reflowable, electrically conductive material and the flux 914 on the contacts.

During a fourth stage 920, the masses 916 of reflowable, electrically conductive material may be inspected to ensure the position of the masses 916 is likely to produce a reliable connection to the underlying contact. In a fifth stage 922 of the process, the reflowable, electrically conductive masking material 908 may be reflowed, improving the contact between the masses 916 of the reflowable, electrically conductive material and the underlying electrically conductive material of each contact. Reflow may involve exposing the masses 916 of reflowable, electrically conductive material to a source of heat, such as, for example, a laser, oven, or furnace. In an optional sixth stage 924 of the process, flux may be removed from the contacts, such as, for example, utilizing a solvent.

In some examples, the resulting masses 916 of reflowable, electrically conductive material shown in FIG. 8 and/or FIG. 9 may optionally be compressed to produce a predetermined height/thickness, a process sometimes called "coining."

In summary, certain embodiments of methods of forming microelectronic device packages may involve placing a microelectronic device proximate to one of a package substrate and a redistribution layer. The microelectronic device and the one of the package substrate and the redistribution layer may be exposed to a heat source to reflow electrically conductive material. Such reflow may form a first electrical connection between the microelectronic device and the one of the package substrate and the redistribution layer. The first electrical connection may include a masking material defined (MMD) contact located in a first region of the one of the package substrate and the redistribution layer. A non-masking material defined (NMMD) contact may also be located in a second, different region of the one of the package substrate and the redistribution layer, the NMMD contact forming a second electrical connection between the microelectronic device and the one of the package substrate and the redistribution layer.

Figure 10:
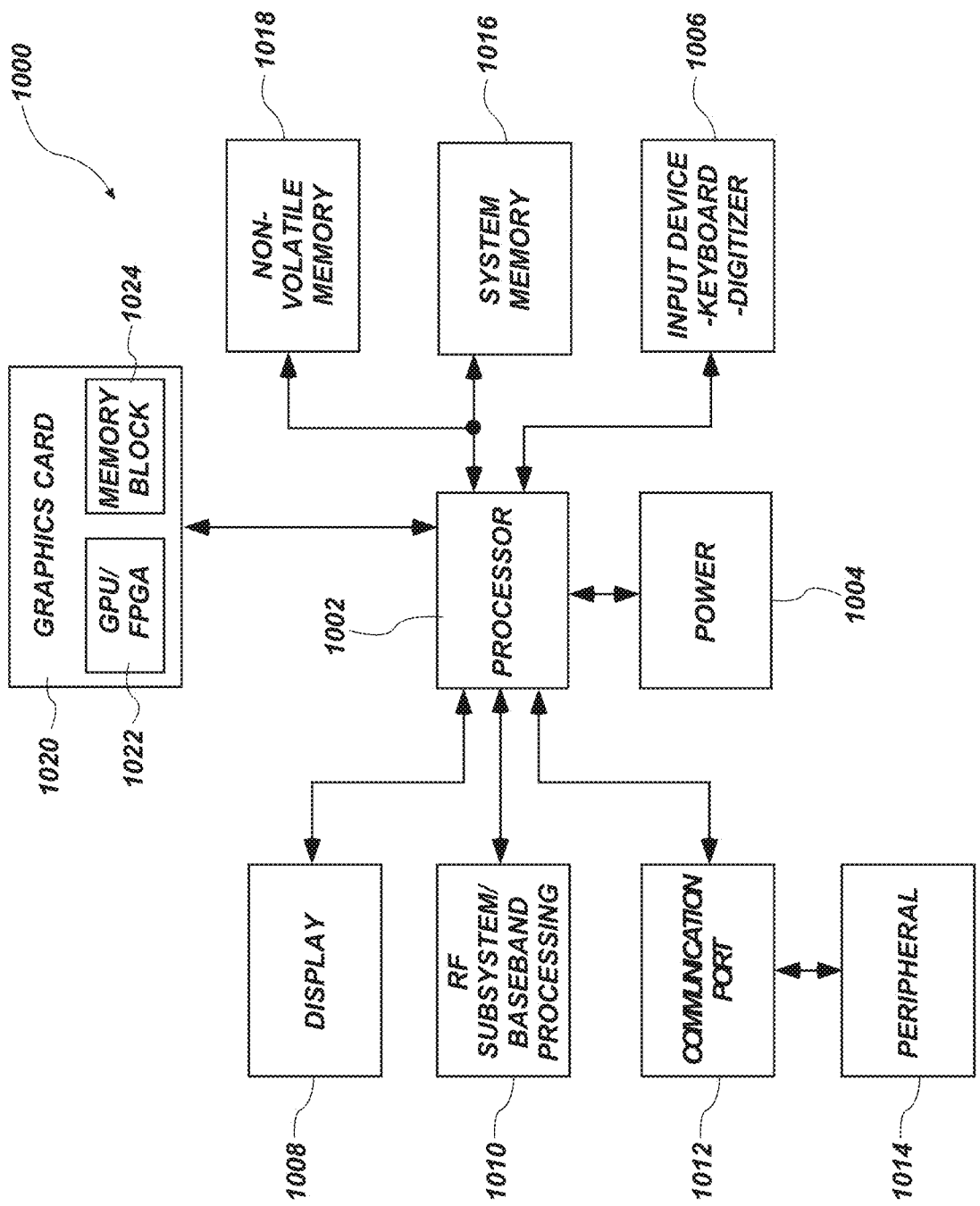
FIG. 10 is a block diagram of an electronic system incorporating one or more microelectronic device packages in accordance with this disclosure.

FIG. 10 is a block diagram of an electronic system 1000 incorporating one or more microelectronic device packages in accordance with this disclosure. For example, the electronic system 1000 may be any of a variety of types, such as a computer, tablet, cellular phone, smartphone, control circuit, or other electronic device. The electronic system 1000 may include one or more processors 1002, such as a microprocessor, to control the processing of system functions and requests in the electronic system 1000. In some examples, the processor 1002 or processors 1002 may include one or more microelectronic device packages in accordance with this disclosure.

The electronic system 1000 may include a power supply 1004 in operable communication with the processor 1002. For example, if the electronic system 1000 is a portable system, the power supply 1004 may include one or more of a fuel cell, a power scavenging device, permanent batteries, replaceable batteries, and/or rechargeable batteries. The power supply 1004 may also include an AC adapter; therefore, the electronic system 1000 may be plugged into a wall outlet, for example. The power supply 1004 may also include a DC adapter such that the electronic system 1000 may be plugged into a vehicle cigarette lighter or a vehicle power port, for example.

Various other devices may be coupled to the processor 1002 depending on the functions that the electronic system 1000 performs. For example, a user interface 1006 may be coupled to the processor 1002. The user interface 1006 may include input devices such as buttons, switches, a keyboard, a light pen, a mouse, a digitizer and stylus, a touch screen, a voice recognition system, a microphone, or a combination thereof. A display 1008 may also be coupled to the processor 1002. The display 1008 may include an LCD display, an SED display, a CRT display, a DLP display, a plasma display, an OLED display, an LED display, a three-dimensional projection, an audio display, or a combination thereof. Furthermore, an RF sub-system/baseband processor 1010 may also be coupled to the processor 1002. The RF sub-system/baseband processor 1010 may include an antenna that is coupled to an RF receiver and to an RF transmitter (not shown). A communication port 1012, or more than one communication port 1012, may also be coupled to the processor 1002. The communication port 1012 may be adapted to be coupled to one or more peripheral devices 1014, such as a modem, a printer, a computer, a scanner, or a camera, or to a network, such as a local area network, remote area network, intranet, or the Internet, for example.

The processor 1002 may control the electronic system 1000 by implementing software programs stored in memory 1016, 1018. The software programs may include an operating system, database software, drafting software, word processing software, media editing software, or media playing software, for example. The memory 1016, 1018 is operably coupled to the processor 1002 to store and facilitate execution of various programs. For example, the processor 1002 may be coupled to system memory 1016, which may include one or more of spin torque transfer magnetic random access memory (STT-MRAM), magnetic random access memory (MRAM), dynamic random access memory (DRAM) (e.g., synchronous DRAM (SDRAM) conforming with a double data rate (DDR) and/or graphics DDR (GDDR) standard (DDR4, DDR5, DDR6)), static random access memory (SRAM), racetrack memory, and other known memory types. The system memory 1016 may include volatile memory, non-volatile memory, or a combination thereof. The system memory 1016 is typically large so that it can store dynamically loaded applications and data.

The processor 1002 may also be coupled to non-volatile memory 1018, which is not to suggest that system memory 1016 is necessarily volatile. The non-volatile memory 1018 may include one or more of STT-MRAM, MRAM, read-only memory (ROM) such as an EPROM, resistive read-only memory (RROM), and flash memory to be used in conjunction with the system memory 1016. The size of the non-volatile memory 1018 is typically selected to be large enough to store any necessary operating system, application programs, and fixed data. Additionally, the non-volatile memory 1018 may include a high-capacity memory such as disk drive memory, such as a hybrid-drive including resistive memory or other types of non-volatile solid-state memory, for example. In some examples, the system memory 1016, non-volatile memory 1018, or system memory 1016 and non-volatile memory 1018 may include one or more microelectronic device packages in accordance with this disclosure.

In some embodiments, the electronic system 1000 may include a graphics subsystem, such as a graphics card 1020, connected to the processor 1002. For example, each of the graphics card 1020 and the processor 1002 may be connected to, and supported on, a motherboard in their respective sockets (e.g., a peripheral component interconnect express (PCIe) socket for the graphics card 1020, a CPU socket for the processor 1002). The graphics card 1020 may include its own processing device, such as a graphics processing unit (GPU) or field-programmable gate array (FPGA) 1022. The GPU or FPGA 1022 may be configured to, and may be a dedicated device for, processing graphics-related tasks to accelerate the creation of images in a frame buffer intended for output to the display 1008. The graphics card 1020 may also include a memory bank, such as, for example, a graphics memory block 1024, which may include one or more high-speed memory devices connected to the GPU or FPGA 1022 and configured to store and facilitate acceleration of graphics-related data. More specifically, the graphics memory block 1024 may include one or more banks of devices configured as dynamic random access memory (DRAM) (e.g., synchronous DRAM (SDRAM) conforming with a double data rate (DDR) and/or graphics DDR (GDDR) standard (GDDR5, GDDR6, GDDR7)). In some examples, the GPU or FPGA 1022, the memory block 1024, or the GPU or FPGA 1022 and the memory block 1024 may include one or more microelectronic device packages in accordance with this disclosure.

Package and contact designs as proposed in this disclosure, which may utilize different designs in different areas and/or for different operational connections, may increase the surface area of dielectric material for bonding to an underfill material, may enable tailoring of contact design to contact pitch, and may reduce the risk of delamination and failure resulting therefrom. As a result, microelectronic device packages in accordance with this disclosure may exhibit lower risk of delamination, may better inhibit propagation of cracks.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure.

What is claimed is:

1. A microelectronic device package, comprising:
   a microelectronic device supported on, and electrically connected to, a package substrate;
   a masking material defined (MMD) contact located in a first region of the package substrate, the MMD contact facilitating a first electrical connection between the microelectronic device and the package substrate; and
   a non-masking material defined (NMMD) contact located in a second, different region of the package substrate, the NMMD contact facilitating a second electrical connection between the microelectronic device and the package substrate.

2. The microelectronic device package of claim 1, further comprising an underfill material interposed between the microelectronic device and the package substrate, the underfill material in contact with the MMD contact and the NMMD contact.

3. The microelectronic device package of claim 1, wherein a pitch between the MMD contact and an additional MMD contact in the first region of the package substrate is greater than or equal to about 110 µm.

4. The microelectronic device package of claim 1, wherein a pitch between the NMMD contact and an additional NMMD contact in the second, different region of the package substrate is less than about 110 µm.

5. The microelectronic device package of claim 1, wherein the masking material covers between about 30 percent and about 50 percent of a surface area of the package substrate within a footprint of the microelectronic device.

6. The microelectronic device package of claim 1, wherein a majority of contacts of the package substrate located proximate to a center of the package substrate are configured as MMD contacts.

7. The microelectronic device package of claim 1, wherein a majority of contacts of the package substrate located proximate to a periphery of the one of the package substrate and the redistribution layer are configured as NMMD contacts.

8. The microelectronic device package of claim 1, wherein all contacts of the package substrate configured to connect to a source of electrical power or electrical ground are configured as MMD contacts.

9. The microelectronic device package of claim 1, wherein a majority of contacts of the package substrate configured to connect to data input or data output are configured as NMMD contacts.

10. The microelectronic device package of claim 1, wherein the NMMD contact comprises a trace located on a major surface of the package substrate.

11. The microelectronic device package of claim 1, wherein two adjacent MMD contacts of the package substrate are electrically connected to one another.

12. The microelectronic device package of claim 1, wherein at least one lateral side of the MMD contact is free of masking material on the at least one lateral side of the MMD contact.

13. The microelectronic device package of claim 1, wherein a greatest diameter of the MMD contact is less than a greatest diameter of a bond pad of the microelectronic device adjacent to the MMD contact.

14. The microelectronic device package of claim 1, wherein a first thickness of the MMD contact, as measured from a major surface of the package substrate and in a direction perpendicular to the major surface of the package substrate, is less than a second thickness of the NMMD contact, as measured from the major surface and in the direction perpendicular to the major surface.

15. A method of forming a microelectronic device package, comprising:
    placing a microelectronic device proximate to a package substrate;
    exposing the microelectronic device and the package substrate to a heat source to reflow electrically conductive material and form:
    a masking material defined (MMD) contact located in a first region of the package substrate, the MMD contact forming a first electrical connection between the microelectronic device and the package substrate; and
    a non-masking material defined (NMMD) contact located in a second, different region of the package substrate, the NMMD contact forming a second electrical connection between the microelectronic device and the package substrate.

16. The method of claim 15, further comprising placing a masking material on a major surface of the package substrate the masking material in contact with one or more lateral sides of a mass of electrically conductive material of the MMD contact to at least partially define boundaries of the MMD contact.

17. The method of claim 16, further comprising removing the masking material from around the NMMD contact such that the NMMD contact is free of contact with the masking material at and proximate to the second region.

18. The method of claim 17, further comprising covering between about 30 percent and about 50 percent of a surface area of the package substrate within a footprint of the microelectronic device with the masking material.

19. The method of claim 15, wherein placing the microelectronic device proximate to the package substrate comprises placing copper pillar bumps of the microelectronic device in contact with contacts of the package substrate, including the MMD contact and the NMMD contact.

20. A system, comprising:
a processor; and
a memory device in electrical communication with the processor, one or more of the processor and the memory device including a microelectronic device package comprising:
a microelectronic device supported on, and electrically connected to, a package substrate;
a masking material defined (MMD) contact located in a first region of the package substrate, the MMD contact facilitating a first electrical connection between the microelectronic device and the package substrate; and
a non-masking material defined (NMMD) contact located in a second, different region of the package substrate, the NMMD contact facilitating a second electrical connection between the microelectronic device and the package substrate.

21. A microelectronic device package, comprising:
a microelectronic device supported on, and electrically connected to, a package substrate;
a first array of masking material defined (MMD) contacts located in a central region of the package substrate, the first array of MMD contacts facilitating first electrical connections between the microelectronic device and the package substrate; and
a second array of non-masking material defined (NMMD) contacts located in a peripheral region of the package substrate, the NMMD contacts facilitating second electrical connections between the microelectronic device and the package substrate.

22. The microelectronic device package of claim 21, wherein the second region at least partially surrounds the first region.

23. The microelectronic device package of claim 21, wherein a pitch between the MMD contact and an additional MMD contact in the first region of the package substrate is greater than or equal to about 110 µm.

24. The microelectronic device package of claim 21, wherein a pitch between the NMMD contact and an additional NMMD contact in the second, different region of the package substrate is less than about 110 µm.

25. A microelectronic device package, comprising:
a microelectronic device supported on, and electrically connected to, a package substrate;
a first array of masking material defined (MMD) contacts located in a first region of the package substrate, the first array of MMD contacts facilitating first electrical connections between the microelectronic device and the package substrate, at least some of the first electrical connections being positioned and configured for connecting to a source of at least one of electrical power and electrical ground; and
a second array of non-masking material defined (NMMD) contacts located in a second, different region of the one of the package substrate and the redistribution layer, the NMMD contacts facilitating second electrical connections between the microelectronic device and the package substrate, at least some of the second electrical connections being positioned and configured for connecting to at least one of data input and data output.

26. The microelectronic device package of claim 25, wherein each contact of the package substrate positioned and configured for connecting to the source of at least one of electrical power and electrical ground is a MMD contact.

27. The microelectronic device package of claim 25, wherein a majority of contacts of the package substrate positioned and configured for connecting to the at least one of data input and data output is a NMMD contact.

* * * * *